(12) United States Patent
Yu et al.

(10) Patent No.: US 6,495,402 B1
(45) Date of Patent: Dec. 17, 2002

(54) SEMICONDUCTOR-ON-INSULATOR (SOI) DEVICE HAVING SOURCE/DRAIN SILICON-GERMANIUM REGIONS AND METHOD OF MANUFACTURE

(75) Inventors: Bin Yu, Cupertino, CA (US); Ralf van Bentum, Radebeul (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/777,637

(22) Filed: Feb. 6, 2001

(51) Int. Cl.[7] .................... H01L 21/00; H01L 21/84
(52) U.S. Cl. ................ 438/149; 438/163; 438/197; 438/217; 438/479; 438/311; 438/517
(58) Field of Search ........................ 438/149, 163, 438/197, 217, 479, 517, 311, 933

(56) References Cited

U.S. PATENT DOCUMENTS

| | | | |
|---|---|---|---|
| 5,168,072 A | * 12/1992 | Moslehi | 438/300 |
| 5,234,535 A | 8/1993 | Beyer et al. | |
| 5,438,015 A | 8/1995 | Lur | |
| 5,461,243 A | 10/1995 | Ek et al. | |
| 5,461,250 A | 10/1995 | Burghartz et al. | |
| 5,583,059 A | 12/1996 | Burghartz | |
| 5,683,934 A | 11/1997 | Candelaria | |
| 5,686,735 A | 11/1997 | Sim | |
| 5,714,777 A | 2/1998 | Ismail et al. | |
| 5,847,419 A | 12/1998 | Imai et al. | |
| 5,906,951 A | 5/1999 | Chu et al. | |
| 5,963,817 A | 10/1999 | Chu et al. | |
| 5,970,351 A | * 10/1999 | Takeuchi | 438/300 |
| 5,998,807 A | 12/1999 | Lustig et al. | |
| 6,048,756 A | * 4/2000 | Lee et al. | 438/151 |
| 6,059,895 A | 5/2000 | Chu et al. | |

FOREIGN PATENT DOCUMENTS

JP          2000-286420       * 10/2000    ......... H01L/29/786

OTHER PUBLICATIONS

JP 2000–286420 (Translation).*
Choi "30 mm ultra–thin body SOI MOSFET with selectively deposited Ge raised S/D", 2000, IEEE, pp. 23–24.*

* cited by examiner

Primary Examiner—Carl Whitehead, Jr.
Assistant Examiner—Maria Guerrero
(74) Attorney, Agent, or Firm—Renner, Otto, Boisselle & Sklar, LLP

(57) ABSTRACT

A semiconductor-on-insulator (SOI) device. The SOI device includes a substrate having a buried oxide layer disposed thereon and an active layer disposed on the buried oxide layer, the active layer having an active region defined by isolation regions, the active region having a source and a drain with a body disposed therebetween, each of the source and the drain having a selectively grown silicon-germanium region disposed under an upper layer of selectively grown silicon, the silicon-germanium regions forming heterojunction portions respectively along the source/body junction and the drain/body junction. A method of fabricating the SOI device is also disclosed.

13 Claims, 2 Drawing Sheets

SEMICONDUCTOR-ON-INSULATOR (SOI) DEVICE HAVING SOURCE/DRAIN SILICON-GERMANIUM REGIONS AND METHOD OF MANUFACTURE

TECHNICAL FIELD

The present invention relates generally to semiconductor-on-insulator (SOI) devices and methods of forming the same and, more particularly, to SOI devices and methods for forming which avoid or reduce floating body effects using a silicon-germanium/silicon heterojunction between the source/drain and the body of a transistor.

BACKGROUND ART

Traditional semiconductor-on-insulator (SOI) integrated circuits typically have a silicon substrate having a buried oxide (BOX) layer disposed thereon. A silicon active layer is disposed on the BOX layer. Within the active layer, active devices, such as transistors, are formed in active regions. The size and placement of the active regions are defined by shallow trench isolation (STI) regions. As a result of this arrangement, the active devices are isolated from the substrate by the BOX layer. In addition, a body region of each SOI transistor does not have body contacts and is therefore "floating."

SOI chips offer potential advantages over bulk chips for the fabrication of high performance integrated circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased since.

However, MOSFETs on SOI materials are known to exhibit parasitic effects due to the presence of the floating body. These effects are known as floating body effects and may result in undesirable performance in SOI devices. It will be appreciated from the foregoing that a need exists for SOI MOSFETs having reduced floating body effects.

SUMMARY OF THE INVENTION

According to one aspect of the invention, the invention is a method of fabricating a semiconductor-on-insulator (SOI) device having a substrate having a buried oxide layer disposed thereon and an active layer disposed on the buried oxide layer, the active layer having an active region defined by isolation regions, the active region having a source and a drain with a body disposed therebetween, and a gate disposed above the body. The method includes the steps of doping the active layer to form source and drain extensions; forming sidewall spacers adjacent the gate; removing a portion of the active layer in the area of each of the source and the drain, the step of removing a portion of the active layer leaving the extensions disposed under the sidewall spacers intact; forming a silicon-germanium region in each of the source and the drain such that the silicon-germanium regions form heterojunction portions respectively along the source/body junction and the drain/body junction; forming an upper layer of silicon on each of the silicon-germanium regions; and doping the source and the drain with deep implants.

According to another aspect of the invention, the invention is a semiconductor-on-insulator (SOI) device. The SOI device includes a substrate having a buried oxide layer disposed thereon; and an active layer disposed on the buried oxide layer, the active layer having an active region defined by isolation regions, the active region having a source and a drain with a body disposed therebetween, each of the source and the drain having a selectively grown silicon-germanium region disposed under an upper layer of selectively grown silicon, the silicon-germanium regions forming heterojunction portions respectively along the source/body junction and the drain/body junction.

According to another aspect of the invention, the invention is a semiconductor-on-insulator (SOI) device, The SOI device having a substrate having a buried oxide layer disposed thereon; and an active layer disposed on the buried oxide layer, the active layer having an active region defined by isolation regions, the active region having a source and a drain with a body disposed therebetween, one of the source or the drain having a selectively grown silicon-germanium region disposed under an upper layer of selectively grown silicon, the silicon-germanium region forming a heterojunction portion with the body.

BRIEF DESCRIPTION OF DRAWINGS

These and further features of the present invention will be apparent with reference to the following description and drawings, wherein.

DISCLOSURE OF INVENTION

Figure 1:
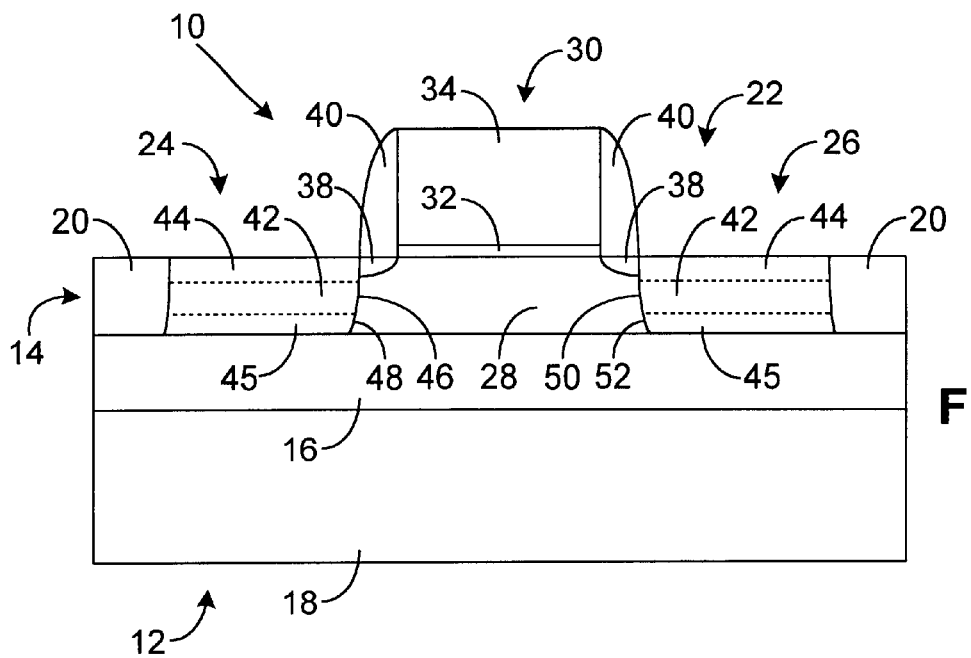
FIG. 1 is a cross-section of a semiconductor-on-insulator (SOI) device according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring to FIG. 1, a semiconductor-on-insulator (SOI) device 10, also referred to herein as a transistor or as a partially-depleted metal oxide semiconductor field effect transistor (MOSFET), is fabricated on an SOI wafer 12 which has an active layer 14 disposed on a buried oxide (BOX) layer 16. In the illustrated embodiment, the active layer 14 is made from silicon, which may or may not be initially doped to form N or P channel devices. However, one skilled in the art will appreciate, other semiconductors may be used with similar results. The BOX layer 16 is disposed on a substrate 18. The substrate 18 can be formed from silicon, polysilicon or another semiconductor material. Within the active layer 14, shallow trench isolation (STI) regions 20 define the placement of active regions 22 used for the fabrication of active devices, such as the device 10 described more fully below.

The device 10 has a source 24 and a drain 26 with a body 28 disposed therebetween. Disposed on top of the body 28 is a gate 30. The gate 30 includes a layer of gate oxide 32 and a polysilicon gate portion 34, or is formed from another gate stack formation as is known in the art. The source 24 and the drain 26 are doped to form extensions 38 using, for example, lightly doped drain (LDD) implants. In addition, side wall spacers 40 are deposited adjacent the gate 30.

The source 24 and the drain 26 each have a silicon-germanium region 42 disposed under an upper layer of silicon 44. In the illustrated embodiment, each of the source 24 and the drain 26 also have a lower layer of silicon 45 disposed between each of the silicon-germanium regions 42 and the BOX layer 16. The silicon-germanium region 42 of the source 24 forms a heterojunction along a portion 46 of a source/body junction 48 where silicon-germanium is present in the source 24 and silicon is present in the body 28. Similarly, the silicon-germanium region 42 of the drain 26 forms a heterojunction along a portion 50 of a drain/body junction 52 where silicon-germanium is present in the drain 26 and silicon is present in the body 28.

The narrow band gap of the silicon-germanium regions 42 cause enhanced leakage along the heterojunction portions 46 and 50 thereby suppressing floating body effects (FBE). More specifically, the heterojunction portions 46 and 50 will readily transport holes from the body 28 respectively to the source 24 and the drain 26. As a consequence charge is removed from the body 28. It is noted that the hererojunction portions 46 and 50 form a relatively large barrier for electron flow. However, the source/body junction 48 and the drain/body junction 52 along the body's interface with the extensions 38 form a silicon/silicon junction which does not exhibit the heterojunction properties of the heterojunction portions 46 and 50, thereby maintaining the performance of the device 10. As a result, electron flow is not subjected to a heterojunction barrier between, for example, the extension 38 portion of the source 24 and the body 28 or the extension 38 portion of the drain 26 and the body 28. The same is found in the silicon/silicon interfaces found between the upper layers of silicon 44 and the body 28 or between the lower layers of silicon 45 and the body 28.

In addition, it is noted that the source 24 and the drain 26, including the upper layers of silicon 44, the silicon-germanium regions 42 and the lower layers of silicon 45, are doped. By way of example, the source 24 and the drain 26 each receive N+ doping (or deep implants) and the body 28 is P doped. Alternatively, the source 24 and the drain 26 each may receive P+ doping and the body 28 is N doped. In another alternative, the body 28 is undoped. In yet another alternative, the source 24 and the drain 26 are each N doped or P doped.

Figure 2:
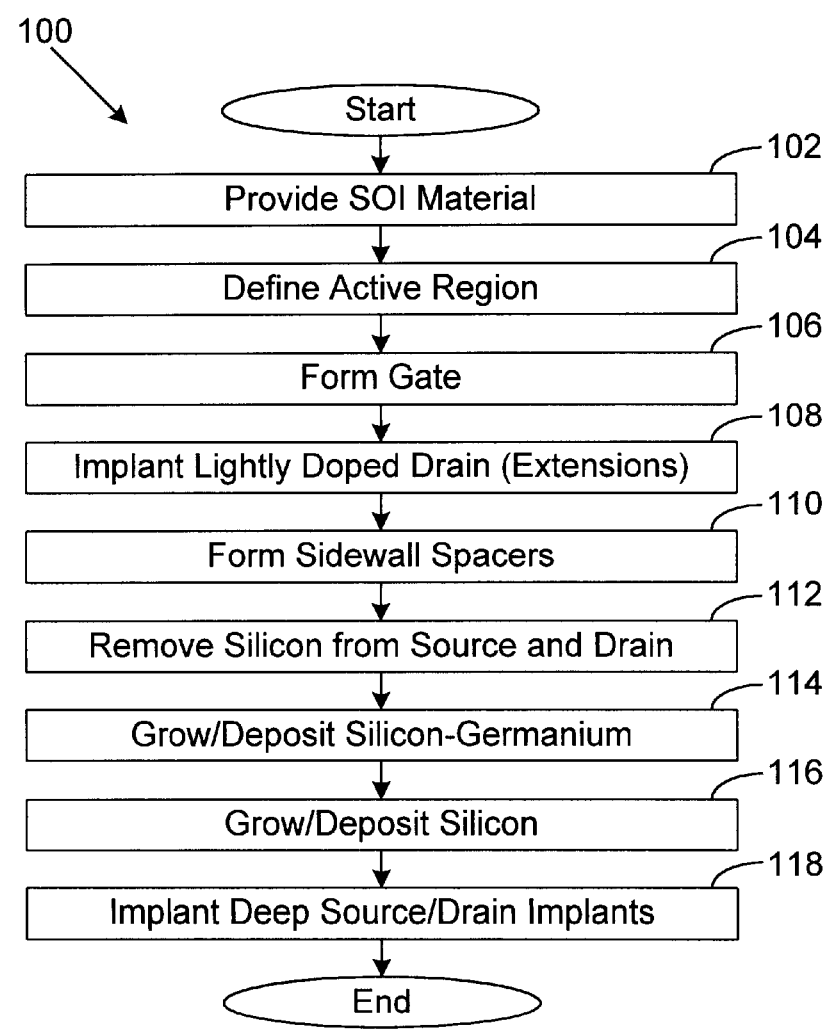
FIG. 2 is a flow chart illustrating a method of fabricating the SOI device.
Figure 3A:
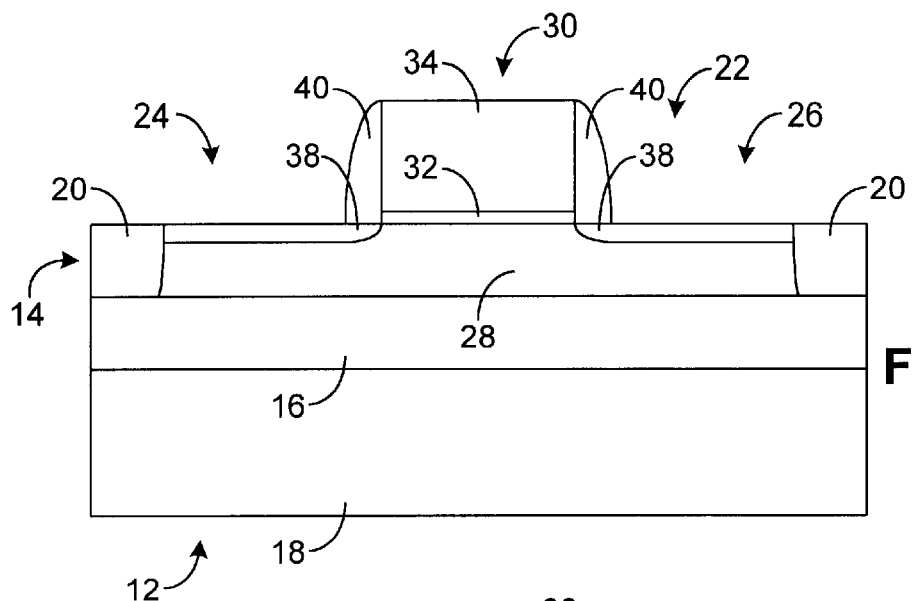
FIGS. 3a–3c are cross-sections of the SOI device in intermediate stages of fabrication.

Referring now to FIG. 2, a method 100 of fabricating the device 10 illustrated in FIG. 1 is shown in flowchart format. With additional reference to FIG. 3a, the method 100 begins in step 102 where a wafer 12 of SOI material is formed. As mentioned, the wafer 12 has a substrate 18 with a buried oxide (BOX) layer 16 disposed thereon. Disposed on the BOX layer 16 is a silicon active layer 14. The active layer 14 may be initially doped for the fabrication of an N-channel device or a P-channel device. The wafer 12 can be formed using conventional techniques, such as wafer bonding or SIMOX.

Next, in step 104, the active region 22 is defined. More specifically, STI regions 20 are formed to define the size and placement of the active region 22. Next, in step 106, the gate oxide layer 32 and the polysilicon gate portion 34, including any additional or alternative gate 30 layers, are formed using conventional techniques.

Next, in step 108, extensions 38 for the source 24 and the drain 26 are implanted. More specifically, the extensions 38 are formed using a lightly doped drain (LDD) technique. For an N-channel device, the extension 38 are formed by implanting, for example, arsenic (As+) at an energy of about 1.0 kev to about 3.0 kev. For a P-channel device, the extensions 38 are formed by implanting, for example, boron (B+) at an energy of about 0.3 kev to about 1.5 kev. Regardless of the channel type, the implantation dose for the extensions 38 is, for example, about $1 \times 10^{14}$ atoms/cm$^2$ to about $1 \times 10^{15}$ atoms/cm$^2$.

Next, in step 110, side wall spacers 40 are formed adjacent the gate 30. The spacers 40 are formed using conventional techniques and are made from a material such as silicon oxide (SiO$_2$) or a nitride (e.g., Si$_3$Na).

Figure 3B:
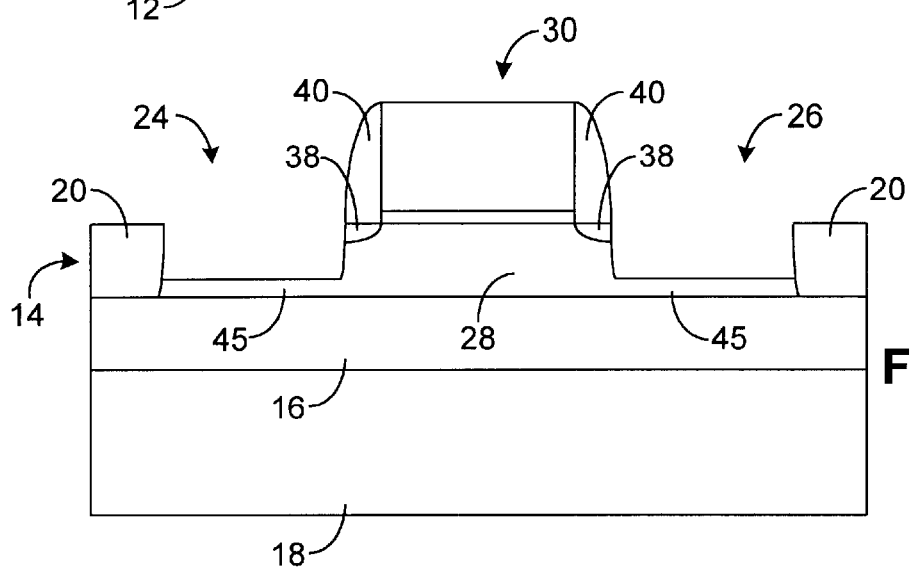

Next, in step 112, and as illustrated in FIG. 3b, the source 24 and the drain 26 regions are etched, or otherwise processed, to remove the silicon of the source 24 and the drain 26 between the STI region 20 and the body 28. The extensions 38 under the spacers 40 are left intact. The source 24 and the drain 26 are etched to a depth of about 600 Å to about 1300 Å, leaving a lower layer of silicon 45 disposed on the BOX layer 16. Alternatively, the silicon of the source 24 and the drain 26 is removed all the way down to the BOX layer 16. Although not illustrated, a mask appropriate for the selected silicon removal technique can be used to protect the gate 30 and other structures disposed on the wafer 12 from damage. After silicon removal, the mask, if used, is stripped.

Figure 3C:
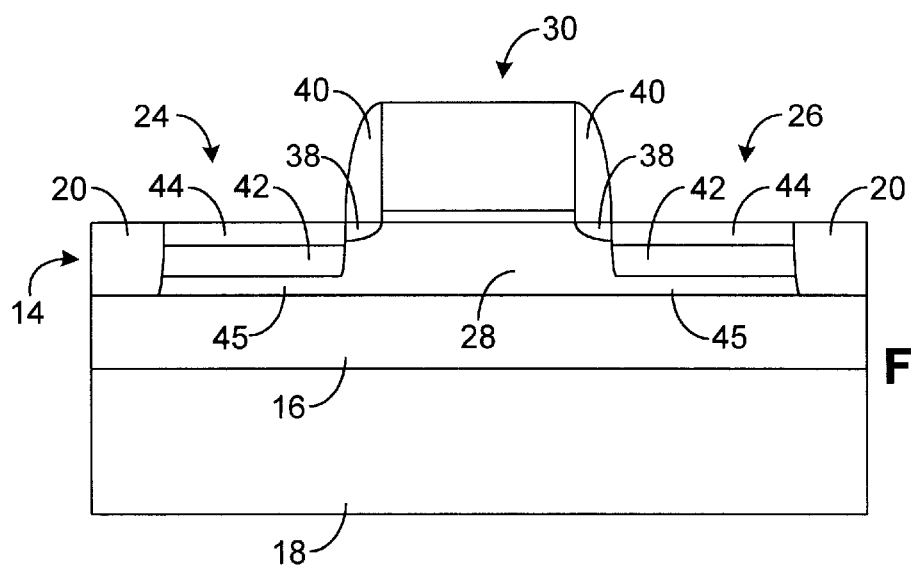

Next, in step 114, and as illustrated in FIG. 3c, silicon-germanium is selectively grown or otherwise deposited in the etched area of the source 24 and the drain 26 using, for example, selective epitaxy, to form the silicon-germanium regions 42. The silicon-germanium has a silicon atomic concentration of about 40% to about 70% and a germanium atomic concentration of about 30% to about 60%. The silicon-germanium region 42 is formed to have a thickness of about 500 Å to about 800 Å. Although not illustrated, a mask appropriate for the selected silicon-germanium deposition technique can be used to protect the gate 30 and other structures from having silicon-germanium deposited thereon. After silicon-germanium deposition, the mask (if used) and any undesired silicon-germanium is stripped.

Next, in step 116, and with continued reference to FIG. 3c, silicon is selectively grown or otherwise deposited in the etched area of the source 24 and the drain 26 on the silicon-germanium regions 42. The silicon is formed using, for example, selective epitaxy, and results in the upper layers of silicon 44. The upper layers of silicon 44 are formed to have a thickness of about 100 Å to about 500 Å. As illustrated in FIG. 3c, the upper layer of silicon 44 has a depth approximately equal to the maximum depth of the extensions 38, but can be slightly shallower or deeper. Although not illustrated, a mask appropriate for the selected silicon deposition technique can be used to protect the gate 30 and other structures from having silicon deposited thereon. After silicon deposition, the mask (if used) and any undesired silicon is stripped.

Next, in step 118, and as illustrated in FIG. 1, the source 24 and the drain 26 are further defined by source/drain deep implantation. For an N-channel device, the deep implantation can be made by implanting arsenic at, for example, an energy of about 5 kev to about 30 kev and a dose of about $1 \times 10^{15}$ atoms/cm$^2$ to about $5 \times 10^{15}$ atoms/cm$^2$. For an p-channel device, the deep implantation can be made by implanting boron at, for example, an energy of about 3 kev to about 15 kev and a dose of about $1 \times 10^{15}$ atoms/cm$^2$ to about $5 \times 10^{15}$ atoms/cm$^2$. As one skilled in the art will appreciate, the source drain deep implantation, as well as formation of the source/drain extensions 38 described above, can be carried out using alternative dopants and/or at other appropriate energy levels and dose levels, as is desirable for the device being fabricated. Following deep implantation in step 118, the wafer 12 is subjected to a thermal cycle, or rapid temperature anneal (RTA) at about 1,000° C. to about 1,050° C. for a period of about 5 seconds to about 10 seconds. In addition, other thermal cycles to recrystallize or amorphize the device 10 can be conducted as desired during the method 100.

Due to the silicon-germanium regions 42, a junction 48 between the source 24 and the body 28 has differing properties along the portion 46 than the remainder of the source/body junction 48. Similarly, a junction 52 between the drain 26 and the body 28 has differing properties along the portion 50 than the remainder of the drain/body junction 52. More specifically, the silicon-germanium regions 42 have a narrow band gap and form a heterojunction with the body 28. The heterojunctions serve to suppress floating body effects by transporting holes from the body 28 respectively to the source 24 and the drain 26 and thereby removing charge from the body 28. The upper layers of silicon 44, the extensions 38 and the lower layers of silicon 45 remain essentially germanium free and do not form heterojunctions. As a result, electron flow is not subjected to a relatively high heterojunction barrier for electron flow between any of the upper layers of silicon 44, the extensions 38 or the lower layers of silicon 45 and the body 28.

Several alternatives to the foregoing device 10 and/or method 100 are contemplated. In one such alternative, a silicon-germanium region 42 can be formed in just one of the source 24 or the drain 26.

In another alternative, the silicon of the source 24 and/or the drain 26 is etched only adjacent the body 28. The resultant silicon-germanium region(s) 42 extend laterally from the source/body junction 48 and/or the drain/body junction 52 only partially across the source 24 and/or drain 26 in a halo-type arrangement.

In yet another alternative embodiment, the silicon of the source 24 and the drain 26 is etched in step 112 to a depth desired for the depth of the upper layers of silicon 44. The silicon-germanium regions 42 are then formed by implanting germanium into the source 24 and the drain 26 in step 114 in lieu of growing or depositing silicon-germanium.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating a semiconductor-on-insulator (SOI) device having a substrate having a buried oxide layer disposed thereon and an active layer disposed on the buried oxide layer, the active layer having an active region defined by isolation regions, the active region having a source and a drain with a body disposed therebetween, and a gate disposed above the body, the method comprising the steps of:

providing an SOI wafer that includes the substrate, the buried oxide layer and the active layer;

doping the active layer to form source and drain extensions;

forming sidewall spacers adjacent the gate;

removing a portion of the active layer in the area of each of the source and the drain, the step of removing a portion of the active layer leaving the extensions disposed under the sidewall spacers intact;

forming a silicon-germanium region in each of the source and the drain such that the silicon-germanium regions form heterojunction portions respectively along the source/body junction and the drain/body junction;

forming an upper layer of silicon on each of the silicon-germanium regions; and doping the source and the drain with deep implants.

2. The method according to claim 1, wherein the silicon-germanium regions are formed by implanting germanium into the source and the drain and the upper layers of silicon are formed by depositing silicon in the removed portions of the active layer on the silicon-germanium regions.

3. The method according to claim 1, wherein the silicon-germanium regions have a silicon atomic concentration of about 40% to about 70% and a germanium atomic concentration of about 30% to about 60%.

4. The method according to claim 1, wherein the silicon-germanium regions have a thickness of about 500 Å to about 800 Å.

5. The method according to claim 1, wherein the upper layers of silicon have a thickness of about 100 Å to about 500 Å.

6. The method according to claim 1, wherein the silicon-germanium regions are each disposed on a lower layer of silicon.

7. The method according to claim 1, wherein the doping technique used to dope the source and the drain to form the extensions is a lightly doped drain technique.

8. The method according to claim 1, wherein the silicon-germanium regions are formed by depositing silicon-germanium in the removed portions of the active layer.

9. The method according to claim 1, wherein the upper layers of silicon are formed by depositing silicon in the removed portions of the active layer on the silicon-germanium regions.

10. The method according to claim 8, wherein the silicon-germanium is deposited using selective epitaxy.

11. The method according to claim 9, wherein the silicon is deposited using selective epitaxy.

12. A method of fabricating a semiconductor-on-insulator (SOI) device having a substrate having a buried oxide layer disposed thereon and an active layer disposed on the buried oxide layer, the active layer having an active region defined by isolation regions, the active region having a source and a drain with a body disposed therebetween, and a gate disposed above the body, the method comprising the steps of:

doping the active layer to form source and drain extensions;

forming sidewall spacers adjacent the gate;

removing a portion of the active layer in the area of each of the source and the drain, the stop of removing a portion of the active layer leaving the extensions disposed under the sidewall spacers intact;

forming a silicon-germanium region in each of the source and the drain such that the silicon-germanium regions form heterojunction portions respectively along the source/body junction and the drain/body junction;

forming an upper layer of silicon on each of the silicon-germanium regions; and doping the source and the drain with deep implants;

wherein an upper surface of each silicon-germanium region has a height equal to or lower than a junction depth of the source and drain extensions.

13. A method of fabricating a semiconductor-on-insulator (SOI) device having a substrate having a buried oxide layer disposed thereon and an active layer disposed on the buried oxide layer, the active layer having an active region defined by isolation regions, the active region having a source and a drain with a body disposed therebetween, and a gate disposed above the body, the method comprising the steps of:

doping the active layer to form source and drain extensions;

forming sidewall spacers adjacent the gate;

removing a portion of the active layer in the area of each of the source and the drain, the step of removing a portion of the active layer leaving the extensions disposed under the sidewall spacers intact and wherein the removal step removes active layer material to a depth lower than a junction depth of the source and drain extensions;

forming a silicon-germanium region in each of the source and the drain such that the silicon-germanium regions form heterojunction portions respectively along the source/body junction and the drain/body junction;

forming an upper layer of silicon on each of the silicon-germanium regions; and doping the source and the drain with deep implants.

* * * * *

UNITED STATES PATENT AND TRADEMARK OFFICE
CERTIFICATE OF CORRECTION

PATENT NO. : 6,495,402 B1
DATED : December 17, 2002
INVENTOR(S) : Yu et al.

It is certified that error appears in the above-identified patent and that said Letters Patent is hereby corrected as shown below:

Column 6,
Line 51, replace "stop" with -- step --

Signed and Sealed this

Fourth Day of March, 2003

JAMES E. ROGAN
*Director of the United States Patent and Trademark Office*